US008975181B2

(12) United States Patent
Li

(10) Patent No.: US 8,975,181 B2
(45) Date of Patent: Mar. 10, 2015

(54) SEMICONDUCTOR DEVICE AND MANUFACTURING METHOD THEREOF

(75) Inventor: Fenglian Li, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 0 days.

(21) Appl. No.: 13/398,837

(22) Filed: Feb. 16, 2012

(65) Prior Publication Data

US 2013/0146950 A1    Jun. 13, 2013

(30) Foreign Application Priority Data

Dec. 12, 2011    (CN) .......................... 2011 1 0412676

(51) Int. Cl.
 H01L 21/44    (2006.01)
 H01L 29/66    (2006.01)
 H01L 29/78    (2006.01)

(52) U.S. Cl.
 CPC ........ H01L 29/6653 (2013.01); H01L 29/7833 (2013.01); H01L 29/7843 (2013.01)
 USPC .................................. 438/655; 257/E21.199

(58) Field of Classification Search
 CPC .............. H01L 29/665; H01L 29/7845; H01L 21/28052; H01L 21/28518; H01L 29/495
 USPC ............................ 257/288, E21.199; 438/655
 See application file for complete search history.

(56) References Cited

U.S. PATENT DOCUMENTS

| 7,718,497 B2 * | 5/2010 | Akasaka et al. ............... 438/275 |
| 7,851,913 B2 * | 12/2010 | Gutt et al. ...................... 257/750 |
| 8,084,824 B2 * | 12/2011 | Yu et al. ......................... 257/369 |
| 2004/0144997 A1 | 7/2004 | Tuttle |
| 2005/0247926 A1 * | 11/2005 | Sun et al. ......................... 257/19 |
| 2008/0251851 A1 * | 10/2008 | Pan et al. ....................... 257/369 |
| 2008/0315321 A1 * | 12/2008 | Ke et al. ......................... 257/383 |
| 2009/0081842 A1 * | 3/2009 | Nelson et al. ................. 438/289 |
| 2009/0090940 A1 * | 4/2009 | Tsurume et al. .............. 257/288 |
| 2009/0108378 A1 * | 4/2009 | Zhu et al. ....................... 257/412 |
| 2009/0191705 A1 * | 7/2009 | Liu et al. ........................ 438/653 |
| 2011/0233696 A1 | 9/2011 | Li |

FOREIGN PATENT DOCUMENTS

| CN | 1503229 A | 6/2004 |
| CN | 1950946 A | 4/2007 |
| CN | 101170066 A | 4/2008 |
| CN | 102017128 A | 4/2011 |

* cited by examiner

*Primary Examiner* — Steven J Fulk
(74) *Attorney, Agent, or Firm* — Innovation Counsel LLP

(57) ABSTRACT

A semiconductor device and manufacture method thereof include a silicide material formed on a source region and a drain region on opposite sides of a gate, wherein the gate having sidewalls on both side surfaces is formed on a substrate. The gate has a first sidewall spacer and a second sidewall spacer on each sidewall, the first spacer has a horizontal portion and a vertical portion, the horizontal portion is located between the second sidewall spacer and the substrate, the vertical portion is located between the second sidewall spacer and the sidewalls. A protecting layer is selectively deposited on the silicide material.

7 Claims, 5 Drawing Sheets

SEMICONDUCTOR DEVICE AND MANUFACTURING METHOD THEREOF

CROSS-REFERENCES TO RELATED APPLICATIONS

This application claims priority under 35 U.S.C. 119 to Chinese Patent Application No. 201110412676.8 filed on Dec. 12, 2011, which is incorporated herein by reference in its entirety.

BACKGROUND OF THE INVENTION

1. Field of the Invention

The present invention relates to semiconductor processing techniques, and more particularly, to semiconductor devices and manufacture methods thereof.

2. Description of the Related Art

With the development of improved semiconductor processing techniques, the feature size of MOSFET is continuously reduced. Attention is drawn to the issue of carrier mobility reduction, and consequently several schemes of carrier mobility enhancement are proposed.

Some of such schemes realize carrier mobility enhancement through applying stress to channel regions of MOSFETs.

Through applying stress to the channel region of a MOS device to induce strains in the channel region, it is possible to influence carrier mobility. Specifically, an NMOS device is electron conductive, the larger the lattice spacing, the smaller the effectiveness of lattice scattering, and thus a larger electron mobility as well as a larger driving current can be achieved. Therefore, it is desirable to apply a tensile stress to the channel of an NMOS device to enlarge the crystal lattice. In contrast, for a PMOS device, the smaller the lattice, the larger the hole mobility, so it is desirable to apply a compressive stress to the channel of a PMOS device.

A method of applying stress to channel regions may employ the coverage stress film technique.

Through deposition of a stress film after forming silicide on a source region, a drain region and a gate, a stress can be transferred to the channel region, so that the device performance can be significantly affected. As an example of stress film, it is known that a $Si_3N_4$ film deposited by thermal chemical vapor deposition has tensile stress, while a $Si_3N_4$ film deposited by plasma chemical vapor deposition has compressive stress.

In order to simultaneously improve NMOS and PMOS device performance, tensile and compressive stress films can be deposited on NMOS and PMOS devices, respectively. For example, a tensile stress film can be deposited, and then it can be etched to remove the tensile stress film on a PMOS device, and then a compressive stress film can be deposited, followed by removing the compressive stress film on an NMOS device.

A stress proximity technique (SPT) is set forward to transfer stress into a channel region more successfully. That is, sidewall spacers on both sides of the gate are reduced in thickness before a stress film is deposited to shorten the distance between the stress film and the channel region, so that the stress in the stress film can be transferred into the channel region more effectively. Consequently, a better stress effect can be achieved.

A SPT implementation method will be described with reference to FIGS. 1A through 1E.

As shown in FIG. 1A, after performing a lightly doped region (LDD) implantation on the substrate 110 using a gate as a mask, a silicon oxide layer 130 and a silicon nitride layer 140 are deposited in sequence.

Next, as shown in FIG. 1B, the silicon oxide layer 130 and the silicon nitride layer 140 are etched to form sidewall spacers 135 and 145, after which source-drain implantation is implemented to form a source region and a drain region on opposite sides of the gate, and then an annealing process is performed.

Thereafter, a metal such as Ni or Pt is deposited on the source region, the drain region and the gate. A silicide forming process is performed to form silicide 160, as shown in FIG. 1C.

Next, as shown in FIG. 1D, the SPT is implemented through removing the sidewall spacer 145 by etching.

Then, as shown in FIG. 1E, a stress film 170 is deposited thereon.

Since the sidewall spacer 145 is removed after defining the source and drain regions with the sidewall spacer 135 and 145, the stress film 170 can be placed more closely to the channel region, so that the stress in the stress film can be transferred into the channel region more effectively.

As shown in FIG. 1D, however, during the process of removing the sidewall spacer 145, a portion of the silicide 160 formed previously may also be removed. Therefore, the SPT scheme described above results in a loss of silicide.

Hence, a new SPT implementation method capable of avoiding silicide loss is highly desired.

BRIEF SUMMARY OF THE INVENTION

Embodiments of this disclosure provide a method of manufacturing semiconductor devices, which can avoid silicide loss while realizing the stress proximity technique. The method includes forming a silicide material on a source region and a drain region on opposite sides of a gate, wherein the gate has sidewalls on both side surfaces and is formed on a substrate. The gate also has a first sidewall spacer and a second sidewall spacer on each sidewall, the first sidewall spacer has a horizontal portion and a vertical portion, the horizontal portion is located between the second sidewall spacer and the substrate, the vertical portion is located between the second sidewall spacer and the sidewalls. The method further includes selectively depositing a protecting layer on the silicide material.

In one embodiment, the protecting layer comprises a conductive material.

In one embodiment, the conductive material is Cobalt Tungsten Phosphide (CoWP) or Cobalt Molybdenum Phosphide (CoMoP);

In one embodiment, the protecting layer has a thickness ranging from 20 Å to 100 Å.

In one embodiment, the method further comprises removing the second sidewall spacer by etching, wherein the protecting layer prevents the silicide material from being removed.

In one embodiment, the step of removing the second sidewall spacer by etching is implemented through a wet or dry etching process.

In one embodiment, after removing the second sidewall spacer, the method further comprises depositing a stress film to cover the protecting layer and the first sidewall spacer.

In one embodiment, the gate is adjacent to a channel region, and when the channel region is n-type channel region, the stress film is a tensile stress film.

In one embodiment, the gate is adjacent to a channel region, and when the channel region is p-type channel region, the stress film is a compressive stress film.

In one embodiment, before the step of selectively depositing a protecting layer on the silicide, the method further comprises forming the silicide material on the gate, the step of selectively depositing a protecting layer on the silicide material includes depositing a protecting layer selectively on the silicide on the source region, the drain region on the opposite sides of the gate, and the gate.

According to another embodiment of this invention, a semiconductor device may include a gate on a substrate, a source region and a drain region on opposite sides of the gate, a silicide material on the source region and the drain region, and sidewall spacers on sidewalls of opposite sides of the gate and the protecting layer on the silicide material.

In one embodiment, the protecting layer includes a conductive material.

In one embodiment, the conductive material is Cobalt Tungsten Phosphide (CoWP) or Cobalt Molybdenum Phosphide (CoMoP);

In one embodiment, the protecting layer has a thickness ranging from 20 Å to 100 Å.

In one embodiment, the semiconductor device further comprises a stress film covering the protecting layer and the sidewall spacers.

In one embodiment, the gate is adjacent to a channel region, and when the channel region is an n-type channel region, the stress film is a tensile stress film.

In one embodiment, the gate is adjacent to a channel region, and when the channel region is a p-type channel region, the stress film is a compressive stress film.

In one embodiment, the semiconductor device further comprises the silicide material on the gate and the protecting layer on the silicide material which is on the gate.

With the method disclosed above, through depositing a protecting layer on the silicide material, the silicide material underneath the protecting layer can be prevented from being etched in the following process of SPT implementation, and therefore silicide loss can be avoided while improving device performance through SPT.

Further features of the present invention and advantages thereof will become apparent from the following detailed description of exemplary embodiments according to the present invention with reference to the accompanying drawings.

BRIEF DESCRIPTION OF THE DRAWINGS

The accompanying drawings illustrate embodiments of the invention and, together with the description, serve to explain the principles of the invention.

The present invention will be more clearly understood from the following detailed description with reference of accompanying drawings, wherein.

DETAILED DESCRIPTION OF THE INVENTION

Figure 1A:
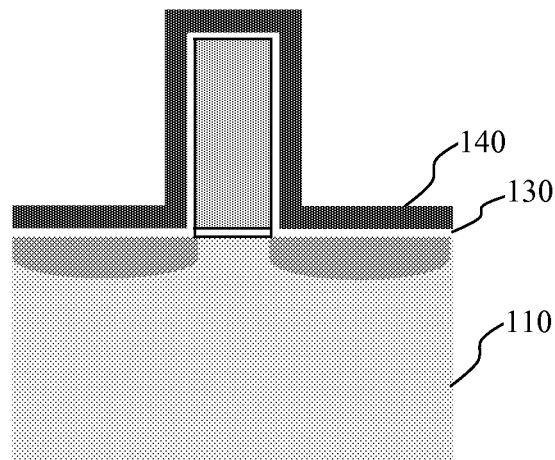
FIGS. 1A-1E sequentially illustrate in cross-sectional views steps of an implementation of the stress proximity technique, as known in the prior art.
Figure 1B:
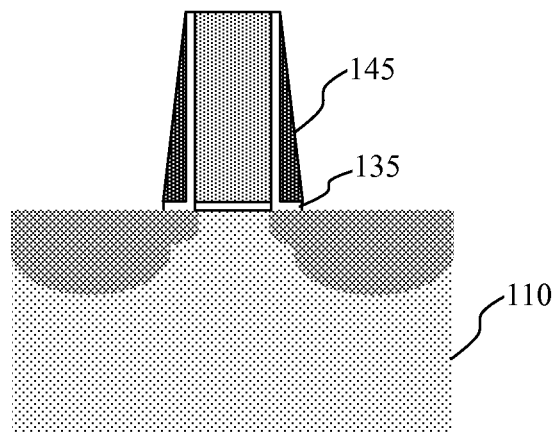

Various exemplary embodiments of the present invention will now be described in detail with reference to the drawings.

It should be noted that the relative arrangement of the components and steps, the numerical expressions, and numerical values set forth in these embodiments do not limit the scope of the present invention unless it is specifically stated otherwise.

It should be noted that in those drawings those parts are not illustrated in actual proportion for the sake of clarity.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In the examples illustrated and discussed herein, any specific values should be interpreted to be illustrative only and non-limiting. Thus, other examples of the exemplary embodiments could have different values.

It should be noted that similar reference numerals and letters refer to similar items in the following figures, and thus once an item is defined in one figure, it is possible that it need not be further discussed for following figures.

Figure 2A:
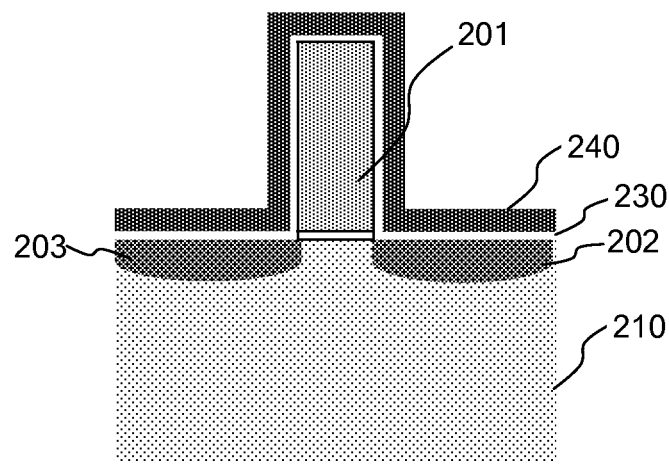
FIGS. 2A-2F sequentially illustrate in cross-sectional views steps of a method of manufacturing a semiconductor device according to an embodiment of the present invention.

Next, an implementation of the method of manufacturing a semiconductor device will be described with reference to FIGS. 2A-2F and FIG. 3. FIG. 2A is a simplified schematic cross-sectional view of a semiconductor device according to an embodiment of the invention. A gate 201 is provided on a substrate 210. Lightly-doped regions 202 and 203 may be included on opposite sides of the gate. A silicon oxide layer 230 is deposited on the lightly-doped regions and on the gate, and a silicon nitride layer 240 is deposited on the silicon oxide layer 230.

Figure 2B:
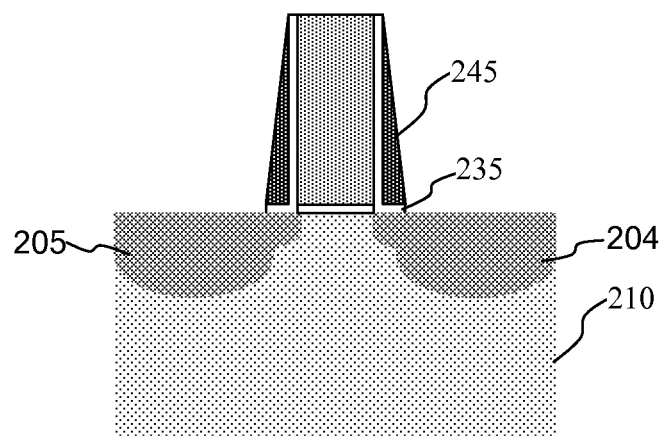

Then, as shown in FIG. 2B, the silicon oxide layer 230 and the silicon nitride layer 240 are etched to form first sidewall spacers 235 and second sidewall spacers 245 on both sides of gate 201. Thereafter, source/drain implantation can be performed to form source and drain regions 204, 205 on both sides of the gate.

Figure 2C:
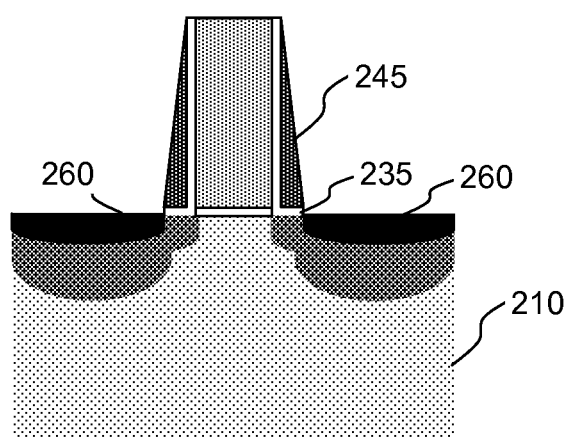
Figure 3:
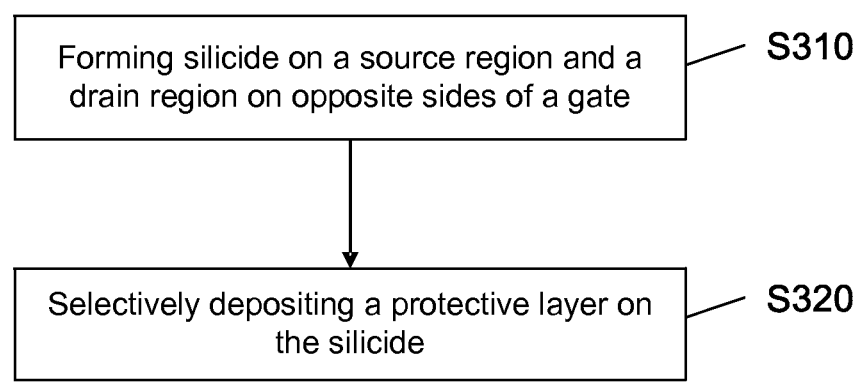
FIG. 3 is a flowchart diagram showing a method of manufacturing a semiconductor device according to an embodiment of the present invention.

In manufacturing step S310 of FIG. 3, a silicide material 260 is formed on the source region and the drain region on opposite sides of the gate, as shown in FIG. 2C. Each of the first sidewalls spacers 235 has a horizontal portion and a vertical portion. The horizontal portion is located between one of the second sidewall spacers and the substrate. The vertical portion is located between one of the second sidewall spacers and a sidewall of the gate.

In an example embodiment, the structure as shown in FIG. 2C can be formed as follows. Referring back to FIG. 2A, gate 201 is formed on substrate 210. The substrate 210 may comprise silicon (Si). The gate is adjacent to a channel region. For example, the gate can be located above the channel region. Upon performing lightly doped region (LDD) implantation with the gate as a mask, oxide layer 230 is deposited to cover the surface of the substrate 210, the upper surface of the gate and sidewalls on both sides of the gate. Then, the nitride layer 240 is deposited.

Next, the oxide layer 230 and the nitride layer 240 are etched as shown in FIG. 2B. Thereafter, on the sidewalls of the opposite sides of the gate, the remaining portion of the oxide layer 230 forms a first sidewall spacer 235 on a sidewall of the gate and the remaining portion of the nitride layer 240 forms a second sidewall spacer 245. The first sidewall spacer 235 has a horizontal portion and a vertical portion. The horizontal portion is disposed between the second sidewall spacer 245 and the substrate 210, and the vertical portion is disposed between the second sidewall spacer 245 and the sidewall of the gate. Then a source-drain implantation is implemented to form a source region and a drain region on the opposite sides of the gate. After that, an annealing process may then be performed employing conventional methodology.

It should be noted that those skilled in the art can understand that the first sidewall spacer may be formed of one or more layers. There may be various methods of implementation for various first sidewall spacers. Different first sidewall spacers and the corresponding implementations to form different first sidewall spacers are known to those skilled in the art, and therefore those details are not described herein.

Next, a silicide material 260 is formed on the source region and the drain region. For example, a metal such as Ni or Pt can be deposited on the source region and the drain region. A silicide forming process is performed to form silicide material 260, as shown in FIG. 2C.

Referring back to FIG. 3, a protecting layer is selectively deposited on the silicide (step S320).

Figure 2D:
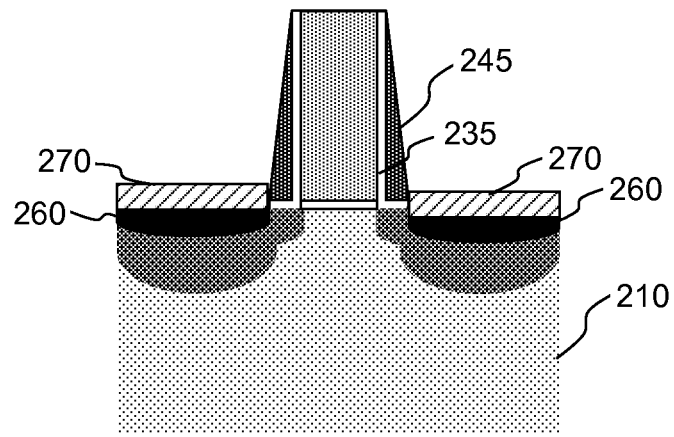

As shown in FIG. 2D, a protecting layer 270 is selectively deposited on the silicide material 260 to cover the silicide material 260.

The protecting layer 270 is used to protect the silicide material 260 from being removed in the following process of SPT implementation during which the second sidewall spacer 245 is removed by etching. As a result, loss of the silicide material 260 is reduced.

The protecting layer 270 may include a conductive material. In one embodiment, the conductive material can be Cobalt Tungsten Phosphide (CoWP) or Cobalt Molybdenum Phosphide (CoMoP).

The protecting layer 270 may have a thickness ranging from 20 Å to 100 Å. In a specific embodiment, the protecting layer is 50 Å thick.

Figure 2E:
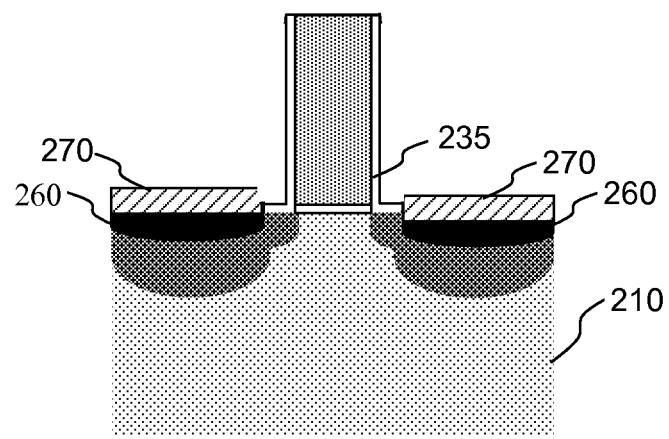

Next, as shown in FIG. 2E, SPT is performed to remove the second sidewall spacer 245 by etching. This step can be implemented through a wet or dry etching process in an embodiment.

As mentioned above, the protecting layer 270 is formed to cover the silicide material 260. Consequently, the silicide material 260 is protected when removing the second sidewall spacer 245 by etching, thereby avoiding the loss of the silicide material 260.

Figure 2F:
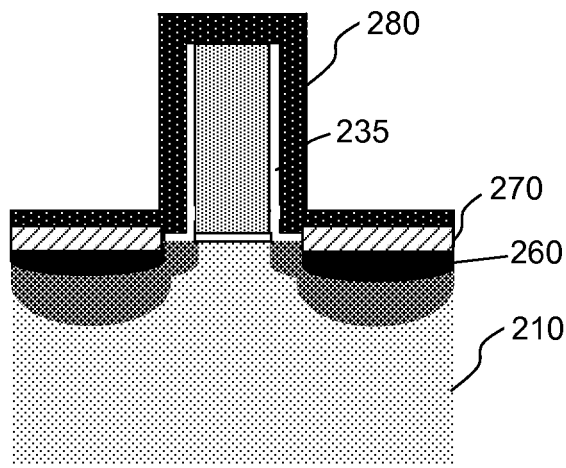

Next, as shown in FIG. 2F, after removing the second sidewall spacer 245 on sidewalls of the opposite sides of the gate, a stress film 280 can be deposited to cover the protecting layer 270 and the first sidewall spacer 235. The gate is adjacent to a channel region that is disposed between the source and drain regions. When the channel region is an n-type channel region, the stress film is a tensile stress film; when the channel region is a p-type channel region, the stress film is a compressive stress film.

Figure 1C:
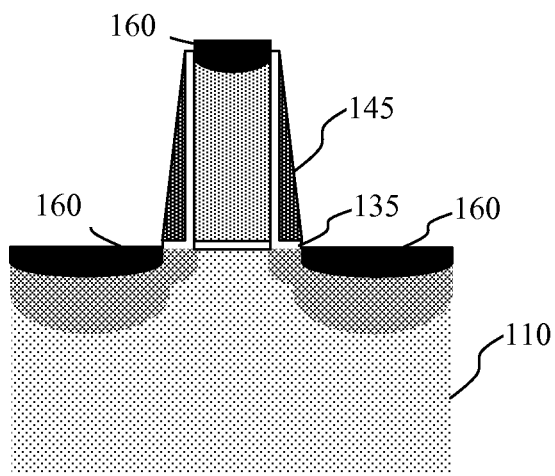
Figure 1D:
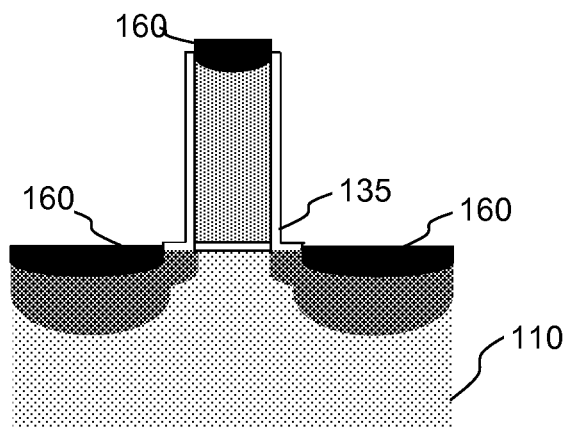
Figure 1E:
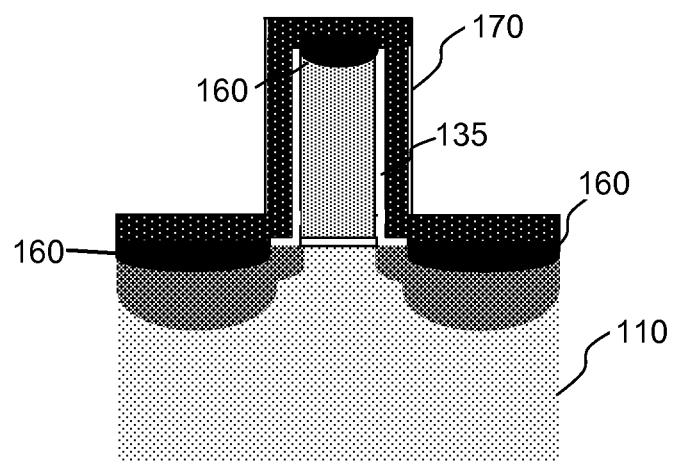

In the embodiment described above, silicide material 260 is formed on the source region and the drain region. The protecting layer 270 is used to protect the silicide material 260 on the source region and the drain region from being removed in the following process of SPT implementation. For different semiconductor devices, silicide may be deposited on other parts of the semiconductor devices. For example, as shown in FIG. 1C, it is necessary to form silicide on the gate. Therefore, in another embodiment, before performing the step of selectively depositing a protecting layer on the silicide, the method may further comprises a step of forming silicide on the gate, besides forming silicide on the source region and the drain region. The step of selectively depositing a protecting layer on the silicide comprises selectively depositing a protecting layer on the silicide on the source region, the drain region as well as the gate.

An implementation of a semiconductor device manufactured by the method of this invention will be described with reference to FIG. 2E.

As shown in FIG. 2E, a semiconductor device manufactured by the above described method includes a gate on a substrate 210, a source region and a drain region on opposite sides of the gate respectively, a silicide material 260 on the source region and the drain region; sidewall spacers 235 on sidewalls of opposite sides of the gate and the protecting layer 270 on the silicide material 260. Each of the sidewall spacers 235 may have a horizontal portion and a vertical portion. The horizontal portion is disposed on the substrate, and the vertical portion is disposed on a sidewall of the gate.

It should be noted that those skilled in the art can understand that the sidewall spacer 235 may be formed of one or more layers. Various compositions of sidewall spacers 235 are well known to those skilled in the art, and therefore those details are not described herein for the sake of brevity.

The protecting layer 270 on the silicide material 260 may include a conductive material. In a specific embodiment, the conductive material can be Cobalt Tungsten Phosphide (CoWP) or Cobalt Molybdenum Phosphide (CoMoP).

The protecting layer 270 has a thickness ranging from 20 Å to 100 Å. In an example embodiment, it can be 50 Å thick.

In a preferred embodiment, the semiconductor device may further include a stress film 280, as shown in FIG. 2F. The stress film 280 covers the protecting layer 270 and the sidewall spacer 235 on sidewalls of opposite sides of the gate. The gate is adjacent to a channel region. When the channel region is an n-type channel region, the stress film 280 is a tensile stress film. When the channel region is a p-type channel region, the stress film 280 is a compressive stress film.

In another embodiment of the semiconductor device, the semiconductor device may further include silicide material on the gate and a protecting layer on the silicide material which is on the gate. The silicide material on the gate can be formed by depositing metal such as Ni or Pt on the gate and then performing silicide forming process to form silicide material.

Thus, the method of manufacturing semiconductor device as well as the semiconductor devices formed by such a method have been described in detail according to this invention. Some details that are well known in the art are not described for the purpose of not obscuring the concept of this invention. With the above description, those skilled in the art can thoroughly understand how to implement the technique solutions disclosed herein.

The above statement is given merely for illustration and description, and is not exhaustive, or to limit the invention to the disclosed form. Many modifications and changes are obvious to those skilled in the art. Embodiments are selected and described for a better illustration of the principle and practical application of this invention, so that those skilled in the art can understand this invention and envisage various embodiments with various modifications suited to specific usages.

What is claimed is:

1. A method of manufacturing a semiconductor device, comprising:
    forming a silicide material on a source region and a drain region on opposite sides of a gate, wherein the gate is formed on a substrate and includes a first sidewall, a second sidewall, and a top surface, and the gate has a first sidewall spacer and a second sidewall spacer disposed respectively on the first and second sidewalls of the gate, the first sidewall spacer including a horizontal portion and a vertical portion, wherein the horizontal portion is located between the second sidewall spacer and the substrate, and the vertical portion is located between the second sidewall spacer and second sidewall;

selectively depositing a protecting layer on the silicide material, wherein the protecting layer comprises a conductive material;

removing the second sidewall spacer by etching; and depositing a stress film covering the protecting layer and the first sidewall spacer, wherein a portion of the stress film is disposed in contact with the top surface of the gate.

2. The method according to claim 1, wherein the conductive material is Cobalt Tungsten Phosphide (CoWP) or Cobalt Molybdenum Phosphide (CoMoP).

3. The method according to claim 1, wherein the protecting layer has thickness ranging from 20 Å to 100 Å.

4. The method according to claim 1,
wherein the protecting layer protects the silicide material from being removed during the removing of the second sidewall spacer by etching.

5. The method according to claim 4, wherein the removing of the second sidewall spacer by etching is implemented through a wet or dry etching process.

6. The method according to claim 1, wherein the stress film is a tensile stress film when the gate is disposed adjacent to an n-type channel region.

7. The method according to claim 1, wherein the stress film is a compressive stress film when the gate is disposed adjacent to a p-type channel region.

* * * * *